United States Patent
Kim (10) Patent No.: US 10,217,784 B2
(45) Date of Patent: Feb. 26, 2019

(54) ISOLATION STRUCTURE AND IMAGE SENSOR HAVING THE SAME

(71) Applicant: Dongbu Hitek Co., Ltd., Seoul (KR)

(72) Inventor: Sang Hwa Kim, Seoul (KR)

(73) Assignee: DB Hitek Co., Ltd, Seoul (KR)

(*) Notice: Subject to any disclaimer, the term of this patent is extended or adjusted under 35 U.S.C. 154(b) by 0 days.

(21) Appl. No.: 15/433,416

(22) Filed: Feb. 15, 2017

(65) Prior Publication Data

US 2017/0250212 A1    Aug. 31, 2017

(30) Foreign Application Priority Data

Feb. 25, 2016 (KR) .................. 10-2016-0022512

(51) Int. Cl.
H01L 27/148 (2006.01)
H01L 27/146 (2006.01)

(52) U.S. Cl.
CPC ...... H01L 27/1463 (2013.01); H01L 27/1461 (2013.01); H01L 27/14612 (2013.01); H01L 27/14643 (2013.01)

(58) Field of Classification Search
CPC ........... H01L 27/1463; H01L 27/14643; H01L 27/1461; H01L 27/14612
See application file for complete search history.

(56) References Cited

U.S. PATENT DOCUMENTS

| | | | |
|---|---|---|---|
| 6,818,930 B2 | 11/2004 | Mouli et al. | |
| 6,888,214 B2 | 5/2005 | Mouli et al. | |
| 9,490,284 B2 * | 11/2016 | Nakamura | H01L 27/14607 |
| 2008/0272455 A1 * | 11/2008 | Inoue | H01L 27/14643 257/445 |
| 2010/0207231 A1 * | 8/2010 | Iwamoto | H01L 27/14625 257/461 |
| 2010/0258709 A1 * | 10/2010 | Rhodes | H04N 3/1568 250/214 R |
| 2011/0242390 A1 * | 10/2011 | Sogoh | H01L 27/14609 348/311 |
| 2011/0304000 A1 * | 12/2011 | Kubo | H01L 27/1463 257/432 |
| 2012/0033119 A1 * | 2/2012 | Shinohara | H01L 27/14623 348/302 |

(Continued)

FOREIGN PATENT DOCUMENTS

KR    20050072485 A    7/2005

OTHER PUBLICATIONS

Application and File History for U.S. Appl. No. 15/372,599, filed Dec. 8, 2016. Inventor: In Guen Yeo.

(Continued)

*Primary Examiner* — Ismail A Muse
(74) *Attorney, Agent, or Firm* — Patterson Thuente Pederson, P. A.

(57) ABSTRACT

Disclosed is an image sensor having an isolation structure. The isolation structure includes a deep well region of a first conductive type disposed in a substrate of a second conductive type and an isolation region disposed between charge accumulation regions for accumulating photo-charges in order to electrically isolate the charge accumulation regions from each other. The charge accumulation regions are disposed on the deep well region and have the second conductive type. The isolation region is connected with the deep well region and has the first conductive type.

8 Claims, 4 Drawing Sheets

(56) References Cited

U.S. PATENT DOCUMENTS

2016/0027899 A1    1/2016  Kim et al.
2016/0099268 A1*   4/2016  Minowa ............ H01L 27/14603
                                                      250/208.1
2017/0148829 A1*   5/2017  Tanaka .............. H01L 27/14623

OTHER PUBLICATIONS

Application and File History for U.S. Appl. No. 15/414,143, filed Jan. 24, 2017. Inventor: Chang Hun Han.

* cited by examiner

ISOLATION STRUCTURE AND IMAGE SENSOR HAVING THE SAME

CROSS-REFERENCE TO RELATED APPLICATION

This application claims the priority benefit of Korean Patent Application No. 10-2016-0022512, filed on Feb. 25, 2016, and all the benefits accruing therefrom under 35 U.S.C. § 119, the contents of which are incorporated by reference in their entirety.

BACKGROUND

The present disclosure relates to an isolation structure and an image sensor having the same. In more detail, the present disclosure relates to an isolation structure for electrically isolating charge accumulation regions from each other and an image sensor having the same.

In general, an image sensor is a semiconductor device that converts an optical image into electrical signals, and may be classified or categorized as a charge coupled device (CCD) or a complementary metal-oxide-semiconductor (CMOS) image sensor (CIS).

The CMOS image sensor includes unit pixels, each including a photodiode and MOS transistors. The CMOS image sensor sequentially detects the electrical signals of the unit pixels using a switching method, thereby forming an image.

The CMOS image sensor is made by forming photodiodes in or on a semiconductor substrate, forming transistors connected to the photodiodes on the semiconductor substrate, forming wiring layers functioning as signal lines connected to the transistors, and forming a color filter layer and micro lenses on or over the wiring layers.

Especially, the CMOS image sensor includes a plurality of pixel regions arranged in rows and columns, and a photodiode, a transfer gate, a floating diffusion region, etc. are formed in or on each pixel region. For example, the photodiode includes a p-type surface layer and an n-type charge accumulation region, and when incident light strikes the surface of the photodiode, electrons (photo-charges) are generated in the depletion region of the p-n junction of the photodiode. The electrons are accumulated in the n-type charge accumulation region, and then moved to the floating diffusion region through the transfer gate.

Recently, as the degree of integration of the CMOS image sensor is improved, the area of the photodiode is gradually decreased, and the sensitivity and dynamic range of the CMOS image sensor may thus be deteriorated. Further, the optical noise of the CMOS image sensor such as a cross-talk may be increased.

SUMMARY

The present disclosure provides an isolation structure having a relatively small area so as to increase an area of a photodiode and an image sensor having the isolation structure.

In accordance with an aspect of the present disclosure, an isolation structure may include a deep well region of a first conductive type disposed in a substrate of a second conductive type and an isolation region disposed between charge accumulation regions for accumulating photo-charges in order to electrically isolate the charge accumulation regions from each other. Particularly, the charge accumulation regions may be disposed on the deep well region and have the second conductive type, and the isolation region may be connected with the deep well region and have the first conductive type.

In accordance with some exemplary embodiments of the present disclosure, the isolation region may have an impurity concentration higher than an impurity concentration of the deep well region.

In accordance with some exemplary embodiments of the present disclosure, the isolation structure may further include an insulating layer disposed on the isolation region and an electrode disposed on the insulating layer and forming an electric field in the isolation region so as to accumulate second photo-charges in the isolation region.

In accordance with some exemplary embodiments of the present disclosure, a first voltage may be applied to the deep well region, a second voltage may be applied to the electrode, and the second voltage may be equal to or higher than the first voltage.

In accordance with some exemplary embodiments of the present disclosure, a first voltage may be applied to the deep well region, a second voltage may be applied to the electrode, and the second voltage may be equal to or lower than the first voltage.

In accordance with some exemplary embodiments of the present disclosure, the isolation region may be an ion implanted region formed by an ion implantation process.

In accordance with another aspect of the present disclosure, an image sensor may include a deep well region of a first conductive type disposed in a substrate of a second conductive type, charge accumulation regions of the second conductive type disposed on the deep well region and accumulating photo-charges, and an isolation region of the first conductive type disposed between the charge accumulation regions in order to electrically isolate the charge accumulation regions from each other, and connected with the deep well region.

In accordance with some exemplary embodiments of the present disclosure, the image sensor may further include pinning layers of the first conductive type each disposed on the charge accumulation regions.

In accordance with some exemplary embodiments of the present disclosure, the isolation region may have an impurity concentration equal to an impurity concentration of the pinning layers.

In accordance with some exemplary embodiments of the present disclosure, the isolation region may have an impurity concentration higher than an impurity concentration of the deep well region.

In accordance with some exemplary embodiments of the present disclosure, the image sensor may further include an insulating layer disposed on the isolation region, and an electrode disposed on the insulating layer and forming an electric field in the isolation region so as to accumulate second photo-charges in the isolation region.

In accordance with some exemplary embodiments of the present disclosure, a first voltage may be applied to the deep well region, a second voltage may be applied to the electrode, and the second voltage may be equal to or higher than the first voltage.

In accordance with some exemplary embodiments of the present disclosure, a first voltage may be applied to the deep well region, a second voltage may be applied to the electrode, and the second voltage may be equal to or lower than the first voltage.

In accordance with some exemplary embodiments of the present disclosure, the substrate may include an epitaxial layer, and the deep well region and the isolation region may be disposed in the epitaxial layer.

In accordance with some exemplary embodiments of the present disclosure, the image sensor may further include low concentration impurity regions of the second conductive type each disposed between the charge accumulation regions and the deep well region, and the low concentration impurity regions may have an impurity concentration lower than an impurity concentration of the charge accumulation regions.

In accordance with still another aspect of the present disclosure, an image sensor may include a deep well region of a first conductive type disposed in a substrate of a second conductive type, a charge accumulation region of the second conductive type disposed on the deep well region and accumulating photo-charges, an isolation region of the first conductive type disposed on one side of the charge accumulation region in order to electrically isolate the charge accumulation region from an adjacent charge accumulation region, and connected with the deep well region, a floating diffusion region disposed to be spaced apart from another side of the charge accumulation region, and a transfer gate disposed on the substrate between the charge accumulation region and the floating diffusion region.

In accordance with some exemplary embodiments of the present disclosure, the charge accumulation region may be a p-type impurity region for accumulating holes, and the isolation region may be an n-type high concentration impurity region.

In accordance with some exemplary embodiments of the present disclosure, the image sensor may further include an insulating layer disposed on the isolation region and an electrode disposed on the insulating layer and forming an electric field in the isolation region so as to accumulate electrons in the isolation region.

In accordance with some exemplary embodiments of the present disclosure, a first voltage may be applied to the deep well region, a second voltage may be applied to the electrode, and the second voltage may be equal to or higher than the first voltage.

In accordance with some exemplary embodiments of the present disclosure, the image sensor may further include a second well region of the first conductive type disposed on the other side of the charge accumulation region, and the transfer gate and the floating diffusion region may be disposed on the second well region.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Exemplary embodiments can be understood in more detail from the following description taken in conjunction with the accompanying drawings, in which.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Figure 1:
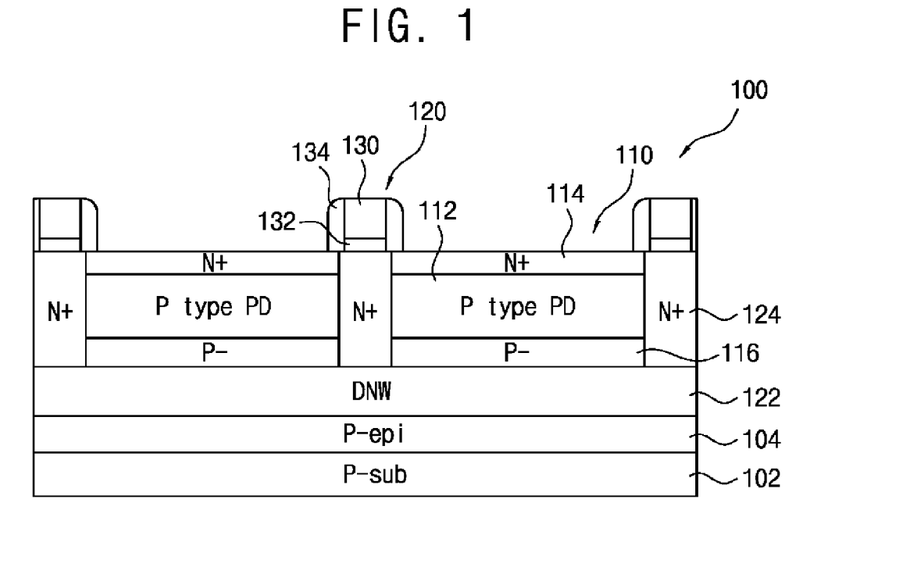
FIG. 1 is a cross-sectional view illustrating an isolation structure and an image sensor having the isolation structure in accordance with an exemplary embodiment of the present invention.
Figure 2:
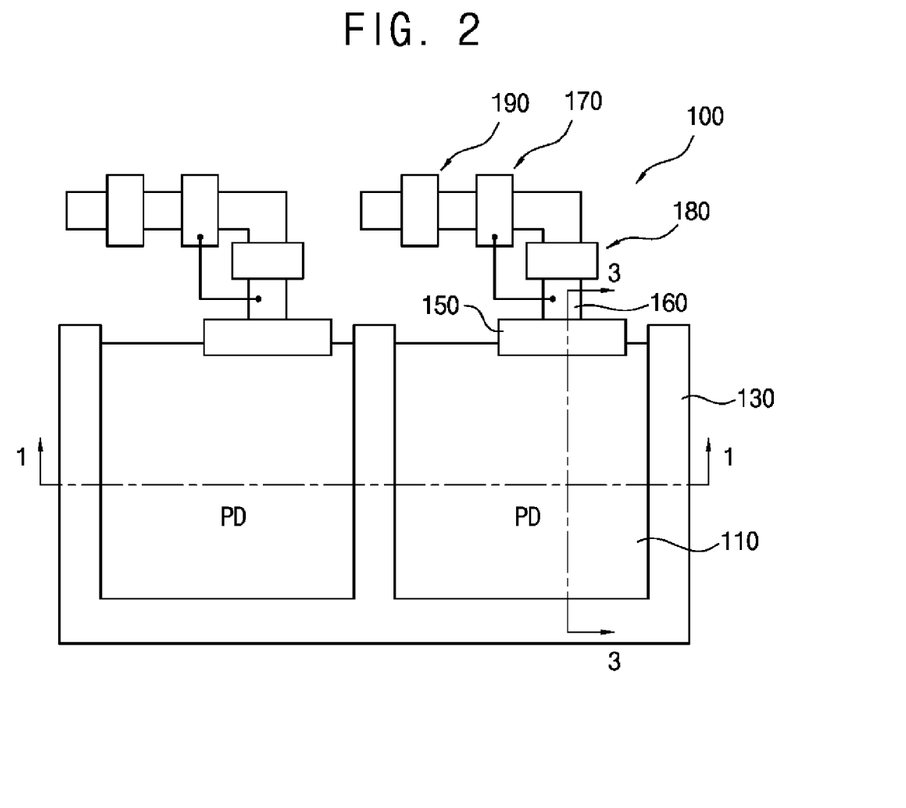
FIG. 2 is a plan view illustrating the image sensor of FIG. 1, wherein the cross-sectional view of FIG. 1 is indicated at line 1-1.
Figure 3:
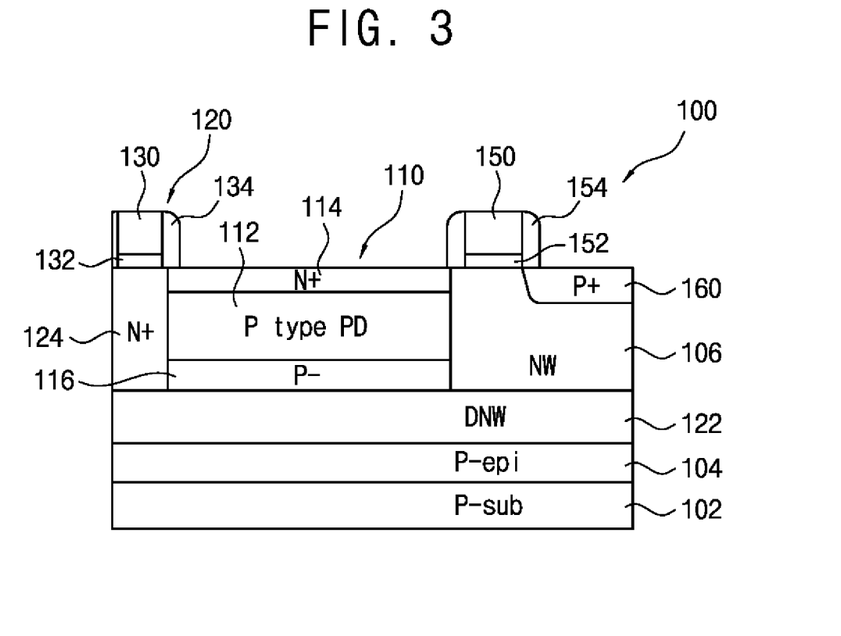
FIG. 3 is a cross-sectional view illustrating a transfer gate and a floating diffusion region of FIG. 2.

FIG. 1 is a cross-sectional view illustrating an isolation structure and an image sensor having the isolation structure in accordance with an exemplary embodiment of the present invention, FIG. 2 is a plan view illustrating the image sensor as shown in FIG. 1, and FIG. 3 is a cross-sectional view illustrating a transfer gate and a floating diffusion region as shown in FIG. 2. Line 1-1 of FIG. 2 shows the cross-section along which FIG. 1 is taken, while line 3-3 shows the cross-section along which FIG. 3 is taken.

Referring to FIGS. 1 to 3, in accordance with an exemplary embodiment of the present disclosure, an image sensor 100 may include a photodiode 110 for accumulating photo-charges generated by the incident photons. The photo-charges accumulated in the photodiode 110 may be moved into a floating diffusion region 160 (FIGS. 2, 3) by an operation of a transfer gate 150. The floating diffusion region 160 may be electrically connected with a gate of a source follower transistor 170 (FIG. 2), and may be reset to a reference voltage by a reset transistor 180 (FIG. 2). Further, the source follower transistor 170 may be connected with a select transistor 190 (FIG. 2).

For example, the image sensor 100 of FIG. 1 may include a plurality of image pixels. The image sensor 100 may include charge accumulation regions 112 formed in a substrate 102. The charge accumulation regions 112 may be used as photodiodes 110 of the image pixels and may be electrically isolated from each other by an isolation structure 120.

The isolation structure 120 may include a deep well region 122 formed in the substrate 102 and an isolation region 124 formed between the charge accumulation regions 112. The deep well region 122 and the isolation region 124 may have a first conductivity type, and the charge accumulation regions 112 may have a second conductivity type. For example, as shown in FIG. 1, the deep well region 122 may be a deep n-type well (DNW) region, and the isolation region 124 may be a high concentration n-type impurity region having an impurity concentration high than that of the deep well region 122. The charge accumulation regions 112 may be p-type impurity regions. Particularly, the isolation region 124 may be formed on the deep well region 122 and may be connected with the deep well region 122 as shown in FIG. 1.

For example, the isolation region 124 may be an ion-implanted region formed by an ion implantation process and may have a relatively small width in comparison with a conventional shallow trench isolation region. As a result, areas of the charge accumulation regions 112 may be increased, and the dynamic range and sensitivity of the image sensor 100 may thus be significantly improved. Further, dark current due to trap sites of the conventional shallow trench isolation region may be removed.

Pinning layers 114 having the first conductive type may be formed on the charge accumulation regions 112. For example, high concentration n-type impurity regions capable of being used as the pinning layer 114 may be formed on the charge accumulation region 112. The pinning layers 114 may have an impurity concentration equal to that of the isolation region 124 and may be electronically connected to upper portions of the isolation region 124.

The substrate 102 may have the second conductive type. For example, a p-type substrate may be used as the substrate 102 as shown in the embodiment of FIG. 1. Alternatively or additionally, the substrate 102 may include an epitaxial layer 104 having the second conductive type. For example, the substrate 102 may include a p-type epitaxial layer 104, and the deep well region 122 and the isolation region 124 may be formed in the p-type epitaxial layer 104.

Low concentration impurity regions 116 having the second conductive type may be formed between the charge accumulation regions 112 and the deep well region 122. The low concentration impurity regions 116 may have an impurity concentration lower than those of the charge accumulation regions 112. For example, the low concentration impurity regions 116 may be un-implanted regions. That is, the low concentration impurity regions may be portions of the p-type epitaxial layer 104.

The image sensor 100 may include a second well region 106 (FIG. 3) of the first conductive type adjacent to the charge accumulation region 112. For example, the second well region 106 may be an n-type well (NW) region formed by an ion implantation process. The second well region 106 may have an impurity concentration lower than that of the isolation region 124. Further, the second well region 106 may have an impurity concentration lower than that of the deep well region 122.

The transfer gate 150 and the floating diffusion region 160 may be formed on the second well region 106. A gate insulating layer 152 may be disposed between the second well region 106 and the transfer gate 150, and gate spacers 154 may be formed on side surfaces of the transfer gate 150.

Further, with reference now to FIG. 2, the reset transistor 180, the source follower transistor 170 and the select transistor 190 may be formed on the second well region 106. The floating diffusion region 160 and source/drain regions of the reset transistor 180, the source follower transistor 170 and the select transistor 190 may be high concentration p-type impurity regions. The reset transistor 180 and the source follower transistor 170 may commonly use a source/drain region. The common source/drain region may be connected with the power supply 140 (See FIG. 4) for supplying a driving voltage (Vdd).

Photo-charges generated in the substrate 102 by the incident photons, e.g., holes may be accumulated in the charge accumulation region 112, and second photo-charges, e.g., electrons may be accumulated in the deep well region 122 and/or the isolation region 124. Particularly, a first voltage, e.g., a driving voltage (Vdd) of approximately 3.3 V may be applied to the deep well region 122 in order to remove the electrons from the image pixels. For example, the deep well region 122 may be connected with the power supply 140.

In accordance with an exemplary embodiment of the present disclosure, the image sensor 100 may include an electrode 130 disposed on the isolation region 124. The electrode 130 may be used to form an electric field in the isolation region 124 so as to accumulate the second photo-charges, e.g., electrons into the isolation region 124. An insulating layer 132 may be disposed between the isolation region 124 and the electrode 130, and spacers 134 may be disposed on side surfaces of the electrode 130. Particularly, a second voltage may be applied to the electrode 130, which may be equal to or higher than the first voltage.

Figure 4:
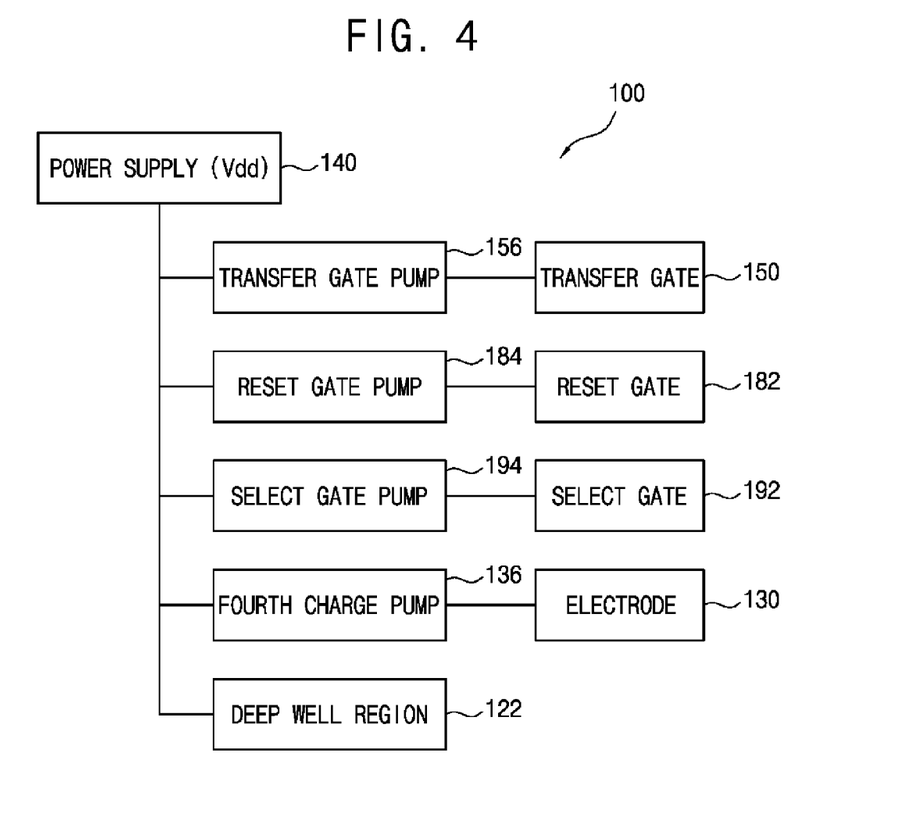
FIG. 4 is a block diagram illustrating a power supply connected with the image sensor of FIG. 1.

FIG. 4 is a block diagram illustrating a power supply connected with the image sensor as shown in FIG. 1.

Referring to FIG. 4, the image sensor 100 may include a plurality of charge pumps connected with the power supply 140. For example, the image sensor 100 may include a transfer gate pump 156 connected with the transfer gate 150, a reset gate pump 184 connected with a reset gate 182, and a select gate pump 194 connected with a select gate 192. Further, the image sensor 100 may include a fourth charge pump 136 connected with the electrode 130, and the fourth charge pump 136 may apply a second voltage higher than the driving voltage (Vdd), e.g., approximately 4 V, to the electrode 130.

Alternatively, when the charge accumulation region 112 has the first conductive type, and the deep well region 122 and the isolation region 124 have the second conductive type, that is, when an n-type photodiode, a p-type isolation region and a deep p-type well (DPW) region are used, electrons may be accumulated in the n-type photodiode, and holes may be accumulated in the p-type isolation region and the deep p-type well region. Particularly, a first voltage of approximately −1 V may be applied to the deep p-type well region, and a second voltage equal to or lower than the first voltage, e.g., approximately −2 V may be applied to the electrode 130.

Further, when the n-type photodiode is used, a first negative charge pump for supplying the first voltage may be connected with the deep p-type well region, and a second negative charge pump for supplying the second voltage may be connected with the electrode 130.

As described above, the second voltage may be applied to the electrode 130 in order to accumulate the second charges, and the photoelectric conversion efficiency of the image sensor 100 may thus be significantly improved. Consequently, the dynamic range and sensitivity of the image sensor 100 may be significantly improved.

Meanwhile, the isolation region 124 and the electrode 130 may be configured to surround the remaining side surfaces except one side surface of the photodiode 110 adjacent to the transfer gate 150, as shown in FIG. 2. Further, the isolation region 124 may be connected with the deep well region 122, and the leakage current from the photodiode 110 may thus be significantly reduced by the deep well region 122 and the isolation region 124. Furthermore, the cross-talk of the image sensor 100 may be sufficiently reduced.

Figure 5:
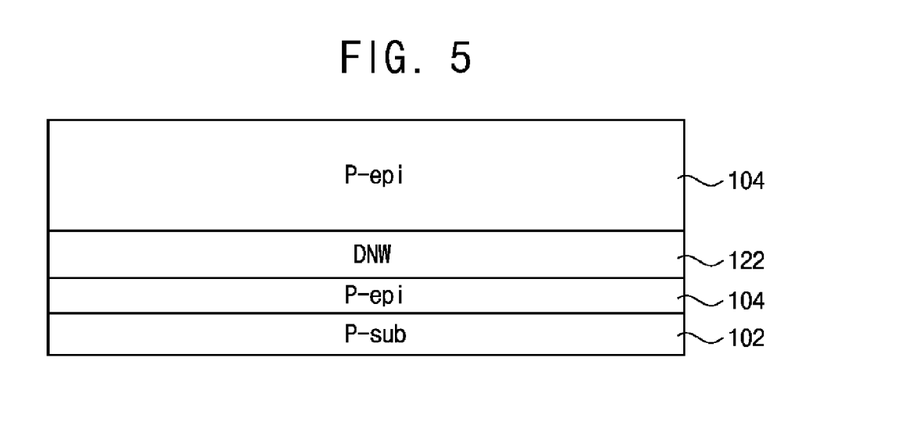
FIGS. 5 to 7 are cross-sectional views illustrating a method of manufacturing the image sensor of FIG. 1.
Figure 6:
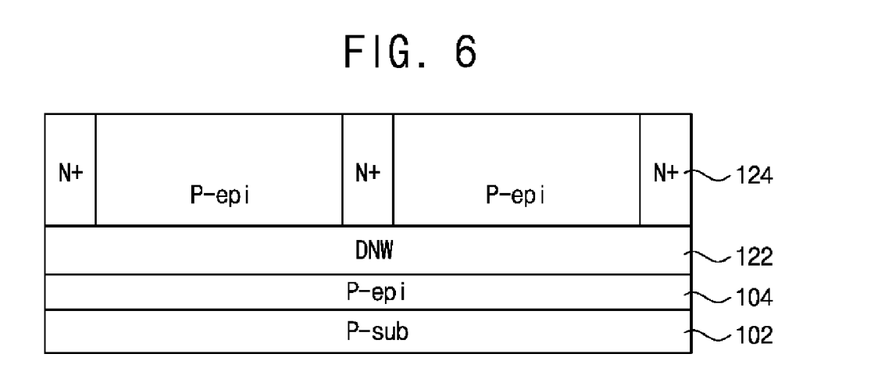
Figure 7:
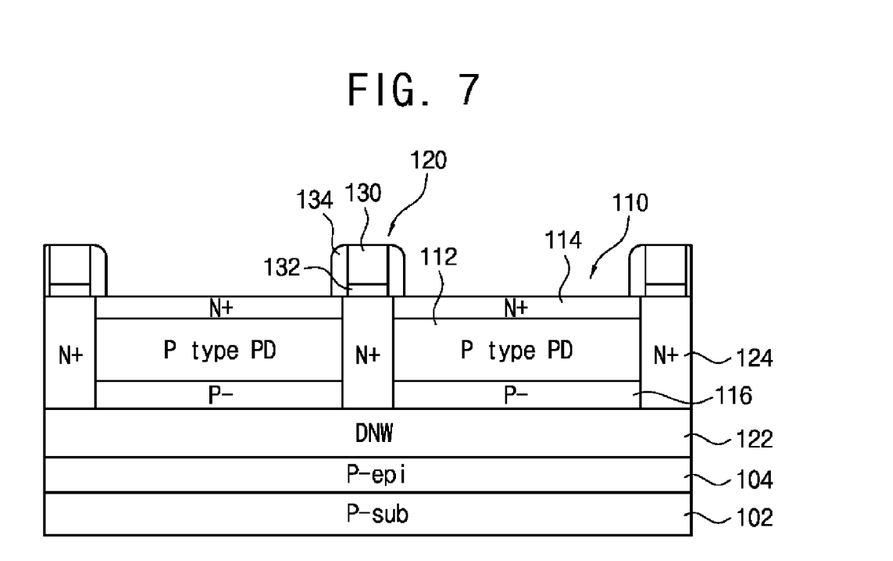

FIGS. 5 to 7 are cross-sectional views illustrating a method of manufacturing the image sensor as shown in FIG. 1.

Referring to FIG. 5, a deep well region 122 of a first conductive type may be formed in a substrate 102 of a second conductive type. For example, the deep well region 122 may be an n-type impurity region and may be formed by an ion implantation process. The substrate 102 may be a p-type substrate and may include a p-type epitaxial layer 104. In such case, the deep well region 122 may be formed in the p-type epitaxial layer 104.

Referring to FIG. 6, an isolation region 124 of the first conductive type may be formed in the substrate 102. The isolation region 124 may be a high concentration n-type impurity region and may be formed by an ion implantation process. The isolation region 124 may extend from an upper surface of the substrate 102, i.e., an upper surface of the p-type epitaxial layer 104 and may be connected to the deep well region 122.

After forming the isolation region 124, a second well region 106 may be formed in the substrate 102 as shown in FIG. 3. The second well region 106 may be an n-type impurity region and may be formed by an ion implantation process.

After forming the second well region 106, a transfer gate 150, a reset gate 182, a source follower gate, a select gate 192 and an electrode 130 may be formed on the substrate 102 as shown in FIGS. 2 and 3. For example, the transfer gate 150, the reset gate 180, the source follower gate and the select gate 192 may be formed of polysilicon doped with p-type impurities, and the electrode 130 may be formed of polysilicon doped with n-type impurities.

Gate insulating layers may be formed on the substrate 102, and the transfer gate 150, the reset gate 180, the source follower gate and the select gate 192 may be disposed on the gate insulating layers. An insulating layer 132 may be formed on the substrate 102, and the electrode 130 may be disposed on the insulating layer 132. The gate insulating layers and the insulating layer 132 may be formed of silicon oxide.

For example, a silicon oxide layer may be formed on the substrate 102, and a polysilicon layer may be formed on the silicon oxide layer. Then, portions of the polysilicon layer corresponding to the transfer gate 150, the reset gate 180, the source follower gate and the select gate 192 may be doped with p-type impurities, and a portion of the polysilicon layer corresponding to the electrode 130 may be doped with n-type impurities. The transfer gate 150, the reset gate 180, the source follower gate, the select gate 192, the gate insulating layers, the electrode 130 and the insulating layer 132 may be obtained by patterning the polysilicon layer and the silicon oxide layer.

Referring to FIG. 7, charge accumulation regions 112 may be formed inside the isolation region 124. The charge accumulation regions 112 may be p-type impurity regions and may be formed by an ion implantation process. Then, pinning layers 114 may be each formed on the charge accumulation regions 112. The pinning layers 114 may be high concentration n-type impurity regions and may be formed by ion implantation process.

Floating diffusion regions 160 may be formed in the substrate 102 as shown in FIG. 3. The floating diffusion regions 160 may be high concentration p-type impurity regions and may be formed by ion implantation process. The floating diffusion regions 160 may by simultaneously formed with source/drain regions of the source follower transistor 170 and the select transistor 190.

In accordance with exemplary embodiments of the present disclosure as described above, an isolation structure 120 of an image sensor 100 may include a deep well region 122 formed in a substrate 102 and an isolation region 124 formed between charge accumulation regions 112 for accumulating photo-charges. When the charge accumulation regions 112 have a second conductive type, the deep well region 122 and the isolation region 124 may have a first conductive type. The isolation region 124 may be an ion-implanted region formed by an ion implantation process, and an electrode 130 may be formed on the isolation region 124. The electrode 130 may be used to form an electric field in the isolation region 124 so as to accumulate second photo-charges in the isolation region 124.

The isolation region 124 may have a relatively small width in comparison with the conventional shallow trench isolation structure, and areas of the charge accumulation regions 112 may be increased. Thus, the dynamic range and the sensitivity of the image sensor 100 may be significantly improved. Further, the dark current due to trap sites of the conventional shallow trench isolation region may be removed.

Still further, the isolation region 124 may be connected with the deep well region 122, and the leakage current from the charge accumulation regions 122 may be significantly reduced. Thus, the cross-talk of the image sensor 100 may be significantly reduced.

Although the image sensor 100 and the method of manufacturing the same have been described with reference to specific embodiments, they are not limited thereto. Therefore, it will be readily understood by those skilled in the art that various modifications and changes can be made thereto without departing from the spirit and scope of the present disclosure defined by the appended claims.

The invention claimed is:

1. An image sensor comprising:
   a deep well region of a first conductive type disposed in a substrate of a second conductive type;
   at least two charge accumulation regions of the second conductive type disposed on the deep well region and configured to accumulate photo-charges;
   an isolation region of the first conductive type disposed between the at least two charge accumulation regions;
   an insulating layer disposed on the isolation region; an electrode disposed on the insulating layer;
   a charge pump connected with the electrode to form an electric field in the isolation region so that second photo-charges are accumulated in the isolation region;

a power supply for applying a first voltage to the deep well region to remove the second photo-charges; and at least two low concentration impurity regions of the second conductive type, each of the at least two low concentration impurity regions being disposed between the at least two charge accumulation regions and the deep well region, wherein the isolation region is connected with the deep well region to electrically isolate the at least two charge accumulation regions, the at least two low concentration impurity regions have an impurity concentration lower than an impurity concentration of the at least two charge accumulation regions, and wherein the at least two charge accumulation regions are p-type impurity regions for accumulating holes, the charge pump applies a second voltage to the electrode to accumulate electrons in the isolation region, and the second voltage is equal to or higher than the first voltage.

2. The image sensor of claim 1, further comprising pinning layers of the first conductive type each disposed on the charge accumulation regions.

3. The image sensor of claim 2, wherein the isolation region has an impurity concentration substantially equal to an impurity concentration of the pinning layers.

4. The image sensor of claim 1, wherein the isolation region has an impurity concentration higher than an impurity concentration of the deep well region.

5. The image sensor of claim 1, wherein the substrate comprises an epitaxial layer, and the deep well region and the isolation region are disposed in the epitaxial layer.

6. An image sensor comprising:
a deep well region of a first conductive type disposed in a substrate of a second conductive type;
a charge accumulation region of the second conductive type disposed on the deep well region and configured to accumulate photo-charges based on light incident thereon;
an isolation region of the first conductive type disposed on a first side of the charge accumulation region in order to electrically isolate the charge accumulation region from an adjacent charge accumulation region, wherein the isolation region is connected with the deep well region;
an insulating layer disposed on the isolation region;
an electrode disposed on the insulating layer;
a charge pump connected with the electrode to form an electric field in the isolation region so that second photo-charges are accumulated in the isolation region;
a power supply for applying a first voltage to the deep well region to remove the second photo-charges;
a floating diffusion region disposed to be spaced apart from a second side of the charge accumulation region;
a transfer gate disposed on the substrate between the charge accumulation region and the floating diffusion region; and
a low concentration impurity region of the second conductive type,
wherein the low concentration impurity region is disposed between the charge accumulation region and the deep well region and has an impurity concentration lower than an impurity concentration of the charge accumulation region, and
wherein the charge pump applies a second voltage to the electrode to accumulate the second photo-charges in the isolation region, and the second voltage is equal to or higher than the first voltage.

7. The image sensor of claim 6, wherein the charge accumulation region is a p-type impurity region for accumulating holes, and the isolation region is an n-type high concentration impurity region.

8. The image sensor of claim 6, further comprising a second well region of the first conductive type disposed on the second side of the charge accumulation region, wherein the transfer gate and the floating diffusion region are disposed on the second well region.

* * * * *